United States Patent [19]

Rosenberg

[11] Patent Number: 5,506,445
[45] Date of Patent: Apr. 9, 1996

[54] OPTICAL TRANSCEIVER MODULE

[75] Inventor: Paul Rosenberg, Sunnyvale, Calif.

[73] Assignee: Hewlett-Packard Company, Palo Alto, Calif.

[21] Appl. No.: 382,831

[22] Filed: Feb. 3, 1995

Related U.S. Application Data

[63] Continuation of Ser. No. 265,592, Jun. 24, 1994, abandoned.

[51] Int. Cl.⁶ .......................... H01L 27/15; H01L 33/00; H01L 23/495
[52] U.S. Cl. .......................... 257/666; 257/684; 257/100; 257/81; 257/82
[58] Field of Search .................................. 257/666, 679, 257/680, 681, 682, 683, 684, 432, 433, 434, 81, 82, 100

[56] References Cited

U.S. PATENT DOCUMENTS

| 4,868,640 | 9/1989 | Shiné | 257/666 |
| 4,924,291 | 5/1990 | Lesk et al. | 257/676 |
| 5,309,460 | 5/1994 | Fujimaki et al. | 257/100 |

FOREIGN PATENT DOCUMENTS

| 54-134992 | 10/1979 | Japan | 257/100 |
| 59-98564 | 6/1984 | Japan | 257/82 |
| 59-98565 | 6/1984 | Japan | 257/82 |
| 62-132377 | 6/1987 | Japan | 257/82 |

*Primary Examiner*—Sara W. Crane
*Assistant Examiner*—Jhihan Clark
*Attorney, Agent, or Firm*—Jonathan B. Penn

[57] ABSTRACT

An integrated optical transceiver for optical serial communication is disclosed. The transceiver is formed as a single molded package incorporating an IC that forms part of the operating circuitry of the transceiver and the leadframe upon which the IC has been mounted. The necessary discrete components comprising at least an LED and photodiode coupled to both the IC and the leadframe. The leads of the leadframe can be formed in several different ways, which permits mounting the integrated transceiver in many different orientations. The integrated transceiver is more durable that transceivers realized using discrete components and provides users with unusual design flexibility, given the plurality of positions in which the transceiver can be mounted.

2 Claims, 7 Drawing Sheets

5,506,445

OPTICAL TRANSCEIVER MODULE

CROSS REFERENCE TO RELATED APPLICATION

This is a continuation of application Ser. No. 08/265,592 filed on Jun. 24, 1994, now abandoned.

BACKGROUND OF THE INVENTION

This invention is generally in the field of optoelectronics and particularly in the field of optical communications.

The use of a light emitting diode ("LED") and either a photodiode or phototransistor, along with appropriate supporting circuitry, to create an optical transceiver is known. A typical communications channel is implemented by two such optical transceivers, the LED in the first transceiver being in optical communication with the photodiode or phototransistor in the second transceiver and the LED in the second transceiver being in optical communication with the photodiode or phototransistor in the first transceiver. Such a pair of transceivers forms an optical serial communications channel. The transceivers typically operate in the infra-red ("IR") optical frequency band.

Known implementations of these optical transceivers have several deficiencies. They are constructed from a plurality of discrete components, which together occupy a significant amount of printed circuit board ("PCB") area. In all known implementations, the LED, and photodiode or phototransistor are discrete, two- or three-pin devices. These components often require manual insertion into the PCB, initial manual alignment, and are always subject to the loss of that alignment, as the two-or three-pin package is not very stable and can be easily bent or damaged. The number of positions that the components can be mounted into or on the PCB to form a viable communications channel is also very limited.

An integrated optical transceiver capable of easy and durable installation into or on a PCB, in any number of positions, and which occupies less PCB area would be a significant advance over known optical transceivers.

SUMMARY OF THE INVENTION

The present invention comprises an optical transceiver module, wherein many of the electronic components of the module are formed as a single integrated circuit ("IC"). The LED and PIN photodiode, however, remain discrete components. The IC and the necessary discrete components are then coupled to a single leadframe. The combination of the leadframe and circuitry is then encapsulated in a plastic-like material. The resultant transceiver comprises a single package which can be mounted in or on a PCB in several different positions. The package is very rigid after mounting, which insures that the optical alignment will not change significantly after initial installation. The package is also adaptable so that robotic assembly devices can be used to mount the transceivers. The different mounting positions require only that the leadframe's leads be bent differently after the encapsulation operation. As only one leadframe, one package design, and one molding operation are needed to create a transceiver which can be mounted in several different positions, the cost of manufacturing the transceiver is kept relatively low.

The invention will now be described in detail, with reference to the figures listed and described below.

BRIEF DESCRIPTION OF THE ILLUSTRATIONS

DETAILED DESCRIPTION OF THE PREFERRED EMBODIMENTS

Figure 1:
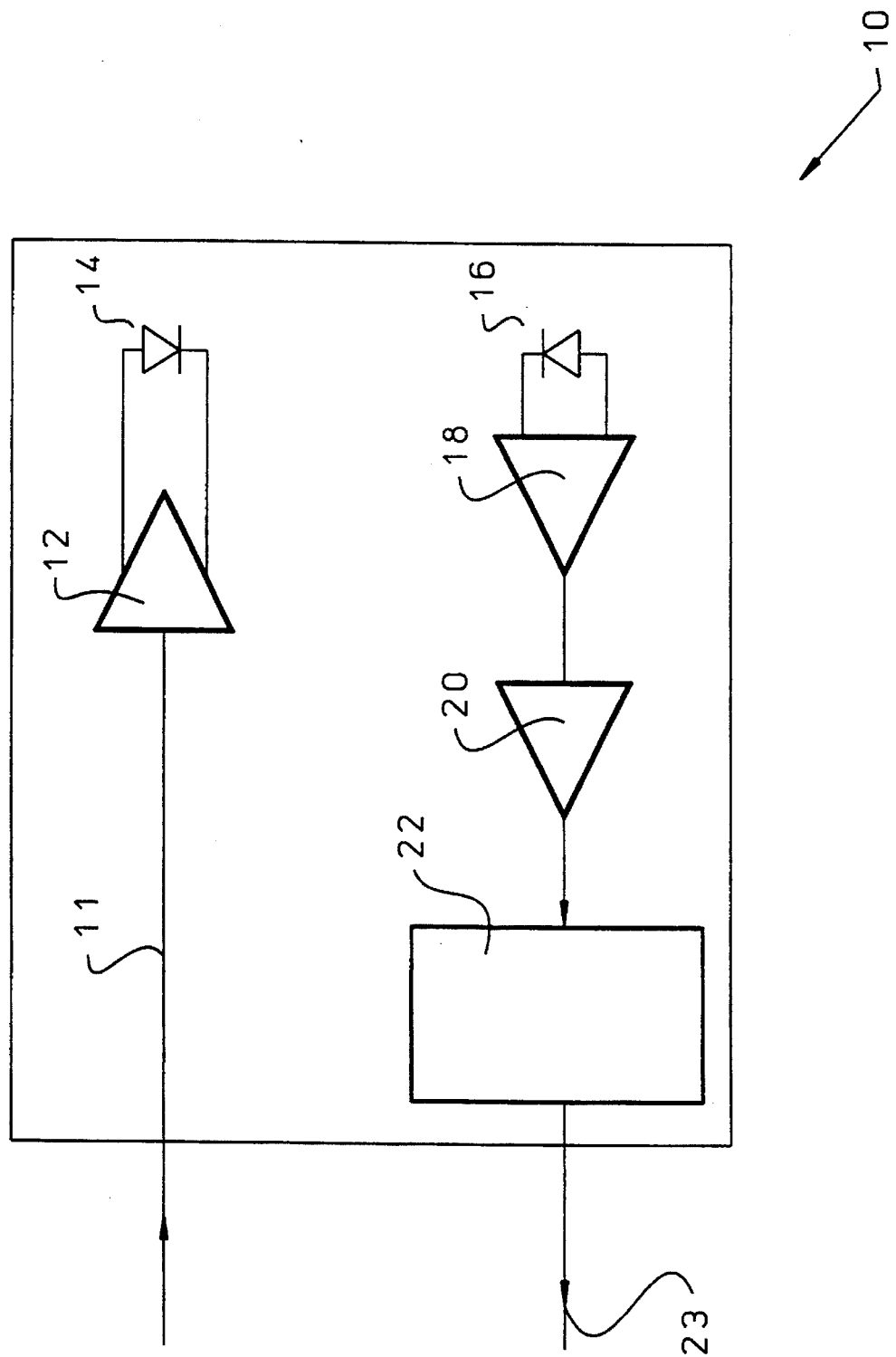
FIG. 1 is a block diagram of the present invention's circuitry.

FIG. 1 is a block diagram showing the electronic components of the first embodiment of the present invention. In optical transceiver module 10, serial pulse input line 11 drives power transistor 12, which is in turn coupled to and drives LED 14, which is an IR LED with an 870 nanometer peak output wavelength. Silicon photodiode 16 receives the incoming pulses of IR light. The output of photodiode 16 is coupled to receiver pre-amplifier 18. The output of pre-amplifier 18 is in turn coupled to post-amplifier 20. Both pre- and post-amplifiers 18 and 20 are known operational amplifiers. The output of post-amplifier 20 is coupled to quantizer 22 which converts the electrical pulses received from post-amplifier 22 into CMOS/TTL compatible logic pulses. These pulses are then transmitted from transceiver 10 over output line 23.

Figure 2A:
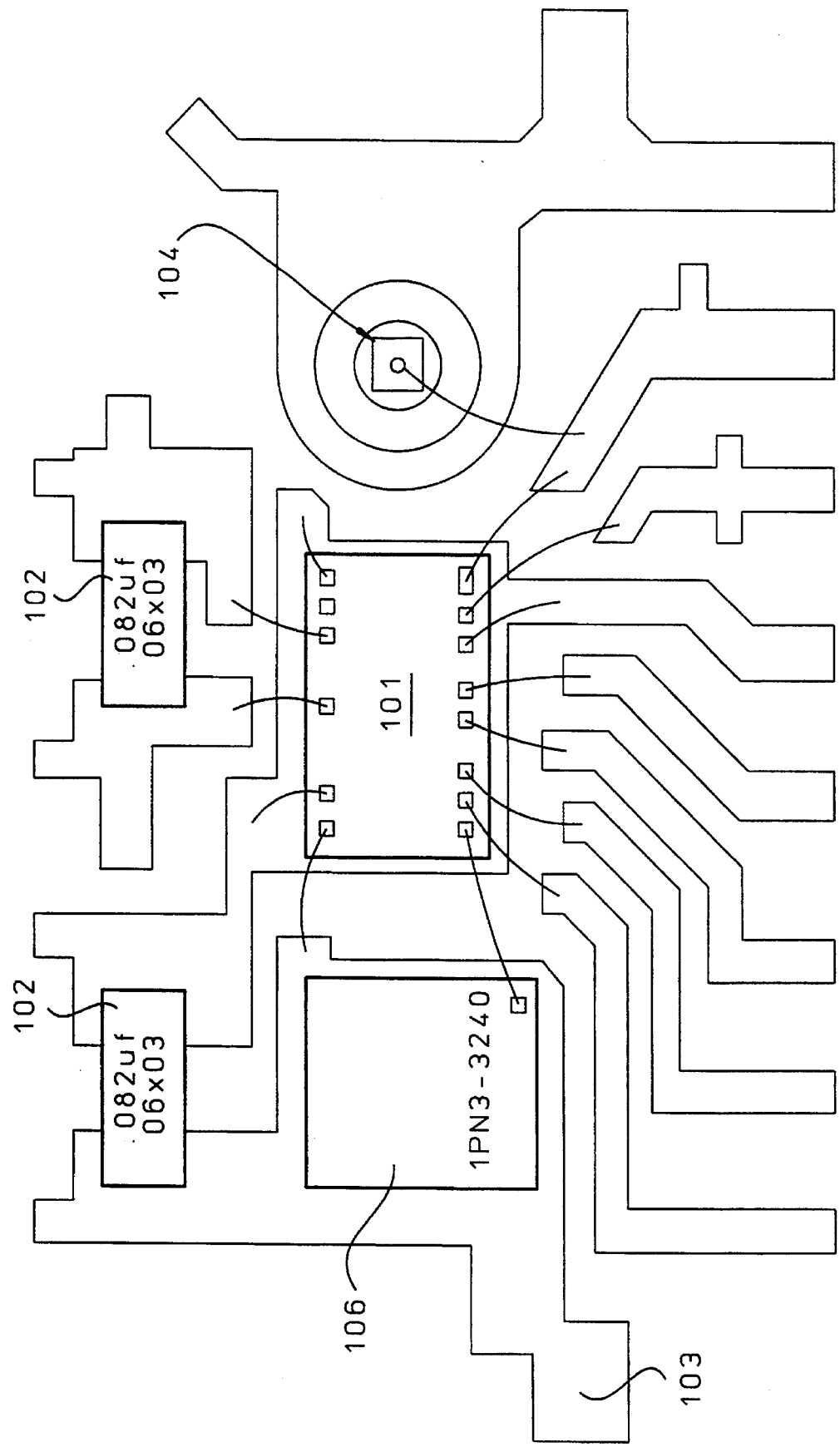
FIGS. 2a and 2b illustrate how a first embodiment of the present invention is assembled.
Figure 2B:
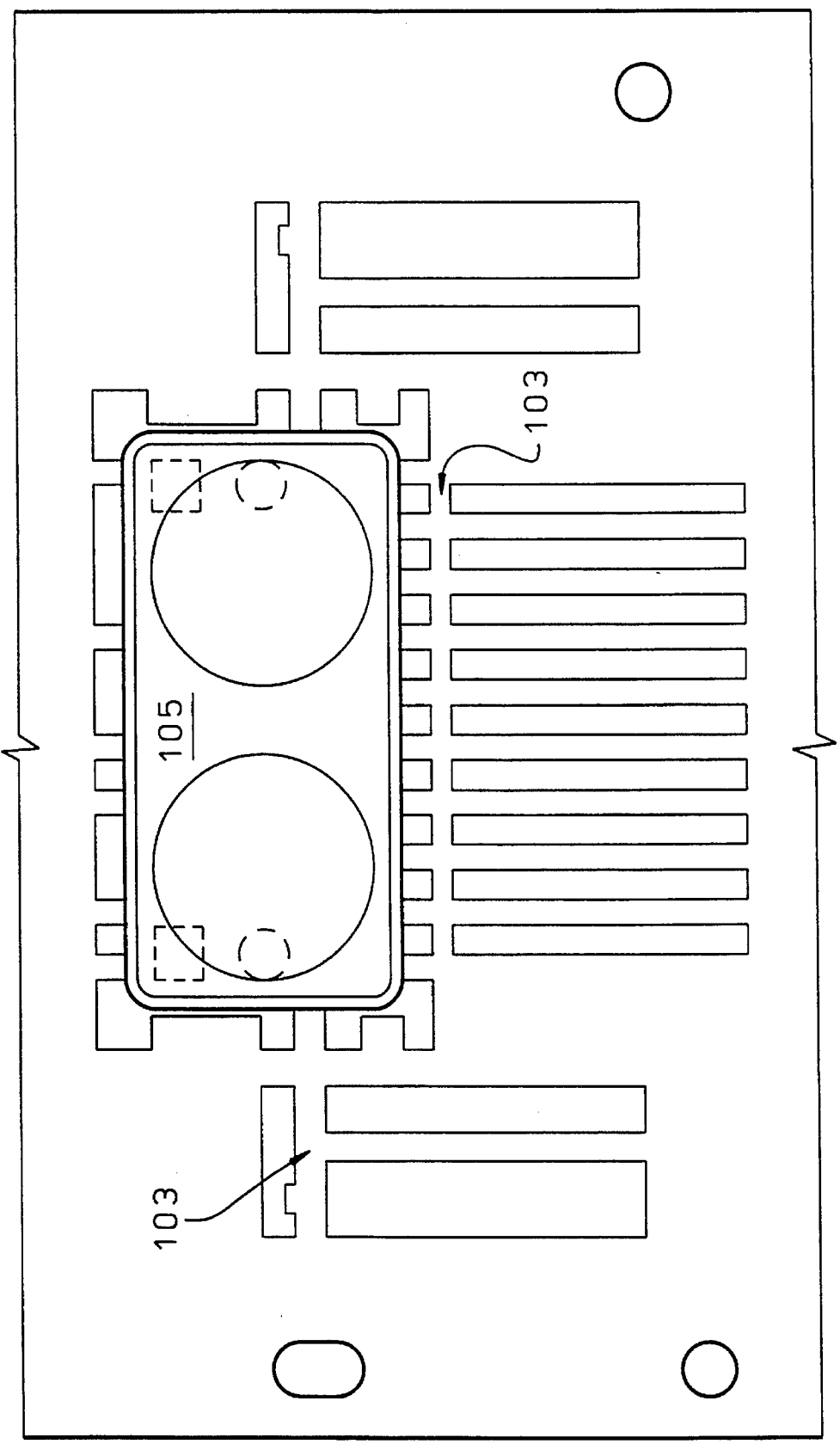
Figure 3A:
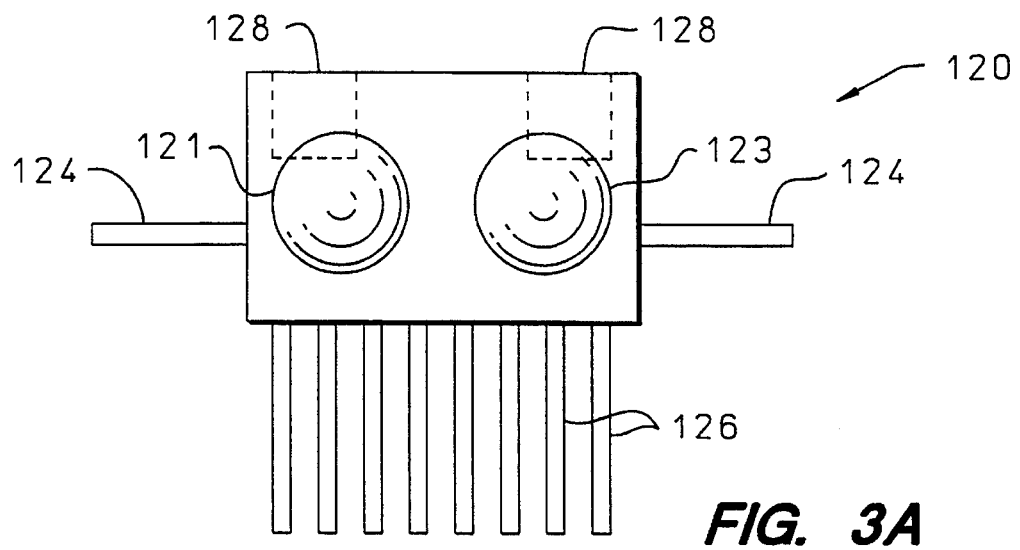
FIGS. 3a through 3d are respectively a front elevation, and a first, second and third side views of the present invention.
Figure 3B:
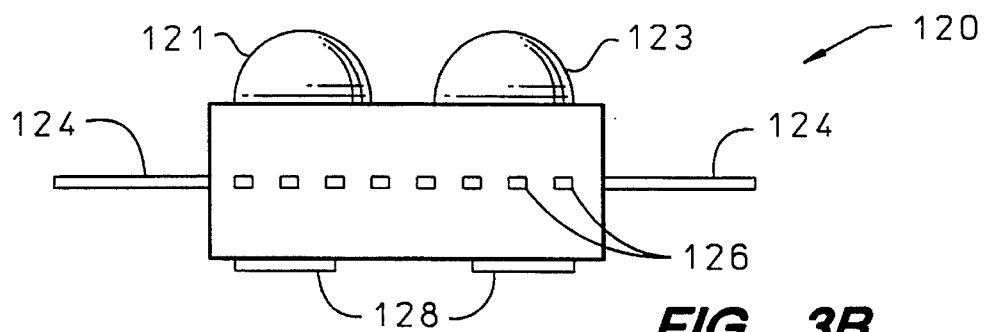
Figure 3C:
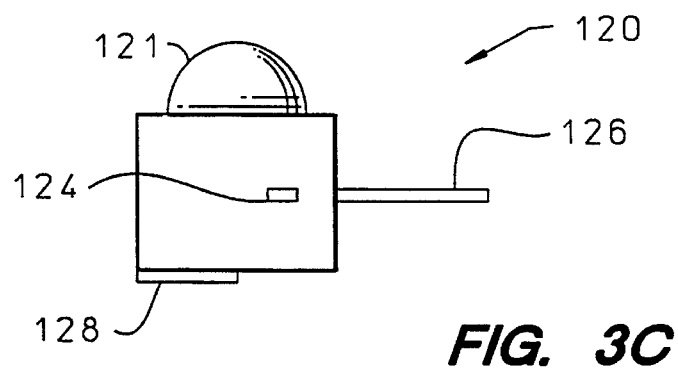
Figure 3D:
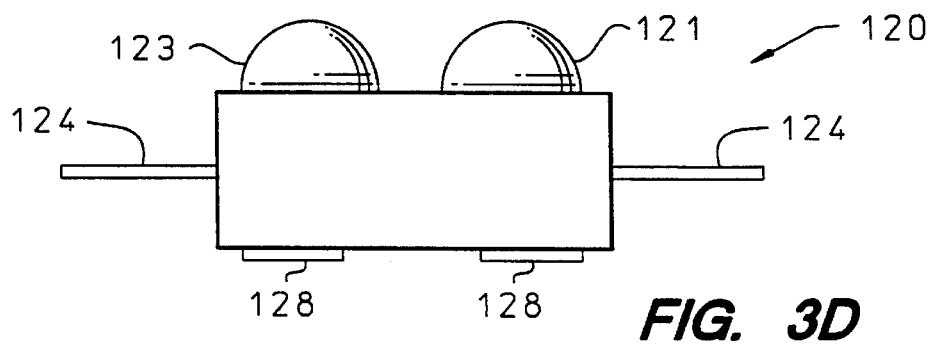

FIGS. 2a and 2b illustrate the basic steps required to fabricate a first embodiment of the present invention. As shown in FIG. 2a, IC 101 is attached to leadframe 103. Capacitors 102, LED 104, and photodiode 106 are also coupled to leadframe 103. In FIG. 2b, leadframe 103 with attached IC 101, capacitors 102, LED 104, and photodiode 106 is inserted into a molding machine (not shown) and transceiver body 105 is molded around the leadframe/IC combination. In this embodiment, MG-18 Hysol is used to form the body of the transceiver. A spectral die has been added to the molding material which leaves it transparent to IR light of about 870 nanometer peak wavelength and opaque to light of other wavelengths.

As shown in FIGS. 3a through 3d, transceiver 120 is formed with a first molded lens shape 121 over the LED (not shown) and a second molded lens shape 123 over the photodiode (not shown). Leadframe tabs 124 extend from the body of transceiver 120 and provide additional support once transceiver 120 has been mounted on a PCB. Leads 126 have not been bent to any particular installation pattern in this illustration. Mounting feet 128 also provide structural support to transceiver 120 in certain mounting positions.

Figure 4:
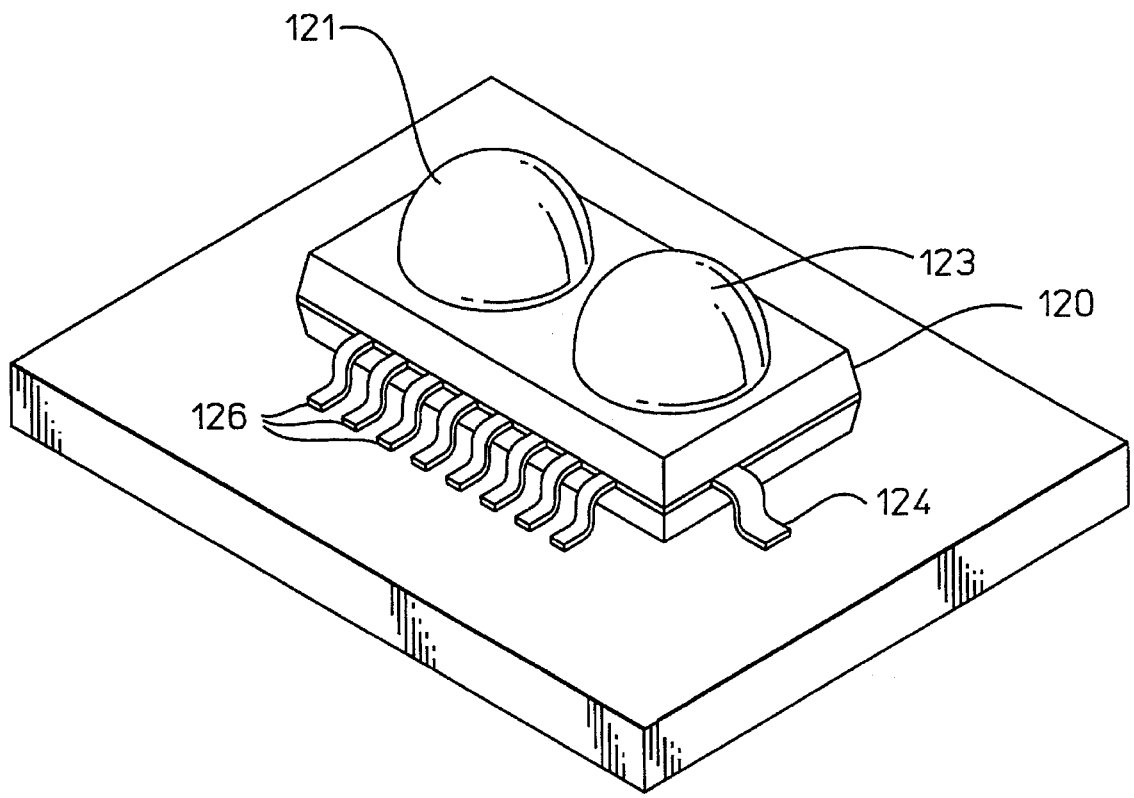
FIG. 4 shows a first mounting position of the present invention.
Figure 5:
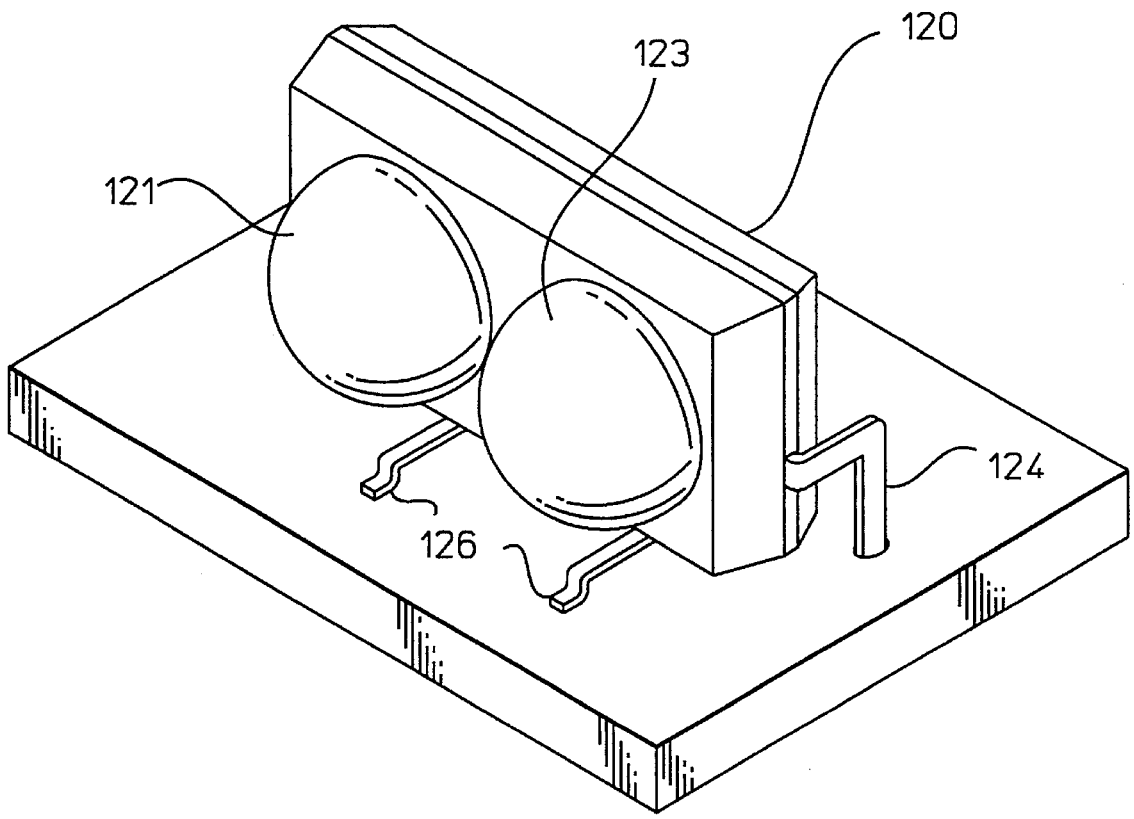
FIG. 5 shows a second mounting position of the present invention.
Figure 6:
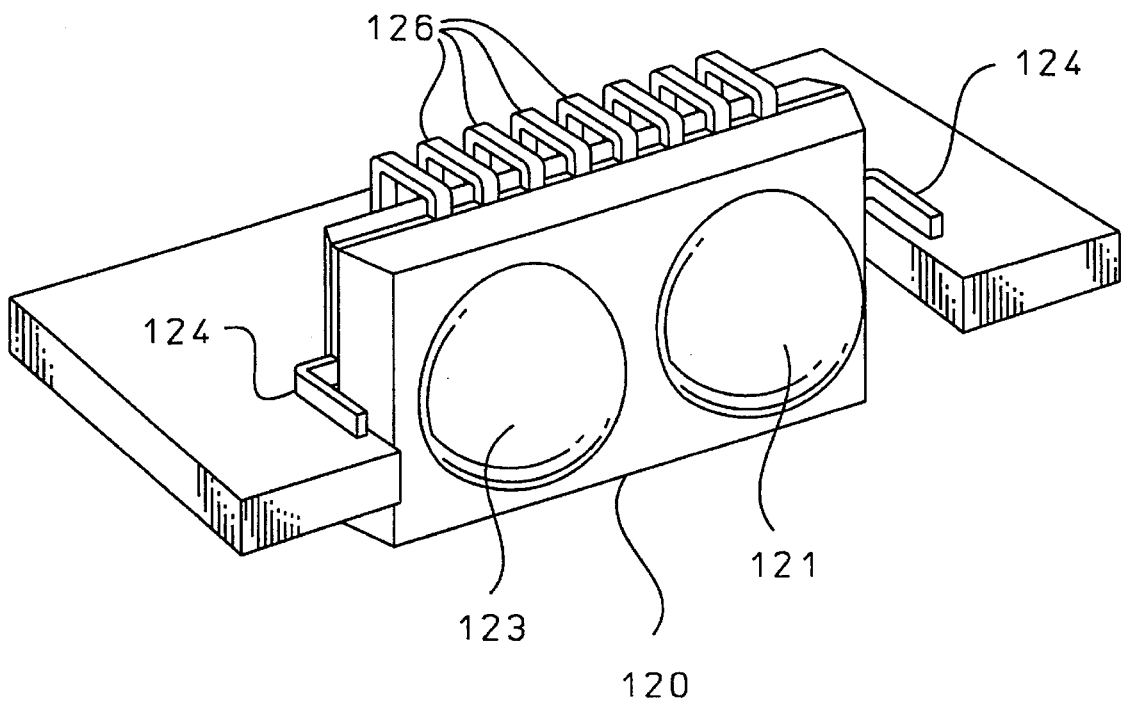
FIG. 6 shows a third mounting position of the present invention.

FIGS. 4, 5, and 6 show how the present invention can be mounted in several different orientations merely by forming leads 126 in different ways. In FIG. 4, transceiver 120 has been surface mounted with the communications channel operating in a direction perpendicular to the PCB. It should be understood that the transceiver leads can be surface mounted or inserted through the PCB without in any way altering the transceiver body. The only alterations required to vary the mounting position or to alternate between surface mounting and through hole mounting are variations in the bending of leads 126 and their final length. In the mounting position shown in FIG. 4, mounting feet 128 (not visible) rest on top of the PCB and further stabilize the transceiver.

FIG. 5 shows transceiver 120 mounted perpendicular to the PCB, with the communications channel operating parallel to the PCB. In this orientation, mounting feet 128 do not provide additional support for the transceiver. That support is provided by leadframe tabs 124 which are bent and inserted into holes on the side of the transceiver.

Another possible mounting position is shown in FIG. 6. In this position, the optical communications channel runs parallel to the PCB, as in the position shown in FIG. 5. However, in the position shown in FIG. 6, the channel is in the same plane as the PCB. A notch cut into the PCB allows transceiver 120 to be mounted and bent so the LED and phototransistor fit into the notch and face outward. Leadframe tabs 124 provide support for the transceiver in this position.

Through hole or surface mounting in any one of these mounting positions can be easily accommodated by forming leads 126 differently. In any of these mounting positions, either the molded mounting feet 128 or leadframe tabs 124 provide structural support. The present invention thus provides an optical communications transceiver which can be mounted on a PCB in many different ways and which will remain properly aligned barring unforeseen damage to the PCB on or in which the transceiver has been mounted.

In those applications where a parallel optical communications channel may be desirable, it can be readily envisioned that several LED/phototransistor pairs could be incorporated into a single package, and that the additional circuitry required to support such operations could also be fabricated on the single IC used herein or formed as discrete components and coupled to the leadframe and the IC.

What is claimed is:

1. An optical transceiver comprising:

an optical transceiver circuit comprising at least a transmitting light emitting diode and a receiving phototransistor;

a leadframe with a plurality of electrical leads upon which the optical transceiver circuit is mounted and to which the optical transceiver circuit is coupled and a plurality of electrically inactive support leads not electrically coupled to the optical transceiver circuit; and molded package surrounding the leadframe and the optical transceiver circuit, the molded package being substantially transparent to the light generated by the light emitting diode and received by the phototransistor, the electrical leads and the support leads of the leadframe extending from the package, and the transceiver having a plurality of mounting positions dependent upon the final configuration of the electrical leads extending from the package, the support leads increasing the stability of the mounted transceiver in each of the plurality of mounting positions.

2. The optical transceiver of claim 1 wherein the optical transceiver circuit further comprises:

an infrared light emitting diode;

a power transistor coupled to the infrared light emitting diode for driving the infrared light emitting diode;

a photodiode which transforms infrared radiation into an electrical current; and a receiver circuit coupled to the photodiode for amplifying and quantizing the electrical current.

\* \* \* \* \*